(12) United States Patent
Yin

(10) Patent No.: US 10,062,687 B2
(45) Date of Patent: Aug. 28, 2018

(54) STACK MOM CAPACITOR STRUCTURE FOR CIS

(71) Applicant: SEMICONDUCTOR MANUFACTURING INTERNATIONAL (SHANGHAI) CORPORATION, Shanghai (CN)

(72) Inventor: Deng-Ping Yin, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/849,589

(22) Filed: Sep. 9, 2015

(65) Prior Publication Data

US 2016/0086940 A1 Mar. 24, 2016

(30) Foreign Application Priority Data

Sep. 22, 2014 (CN) .......................... 2014 1 0486996

(51) Int. Cl.
| | |
|---|---|
| *H01L 27/06* | (2006.01) |
| *H01L 21/265* | (2006.01) |
| *H01L 27/146* | (2006.01) |
| *H01L 23/522* | (2006.01) |
| *H01L 29/861* | (2006.01) |
| *H01L 29/66* | (2006.01) |
| *H01L 49/02* | (2006.01) |

(52) U.S. Cl.
CPC .... *H01L 27/0676* (2013.01); *H01L 21/26586* (2013.01); *H01L 23/5223* (2013.01); *H01L 27/14609* (2013.01); *H01L 27/14643* (2013.01); *H01L 27/14689* (2013.01); *H01L 28/91* (2013.01); *H01L 29/66136* (2013.01); *H01L 29/8611* (2013.01); *H01L 2924/0002* (2013.01)

(58) Field of Classification Search
CPC ........... H01L 27/0676; H01L 27/14679; H01L 28/40; H01L 2924/1436; H01L 27/108; H01L 29/0661; H01L 29/7811; H01L 29/8611; H01L 29/0615; H01L 29/8613; H01L 27/14643; H01L 27/14609
See application file for complete search history.

(56) References Cited

U.S. PATENT DOCUMENTS

| | | | |
|---|---|---|---|
| 6,379,992 B2 * | 4/2002 | Jo ..................... | H01L 27/14609 257/E27.132 |
| 2006/0057765 A1 * | 3/2006 | Hsu ................... | H01L 27/14621 438/70 |

(Continued)

*Primary Examiner* — Mary Wilczewski
*Assistant Examiner* — Tsz Chiu
(74) *Attorney, Agent, or Firm* — Kilpatrick Townsend & Stockton LLP

(57) ABSTRACT

A semiconductor device includes a semiconductor substrate, an interlayer dielectric layer on the semiconductor substrate, a capacitor on the interlayer dielectric layer, and a PN-junction diode in the semiconductor substrate and below the capacitor. The PN-junction diode includes a p-type ion implanted region and an n-well located below the p-type ion implanted region and completely surrounding the p-type ion implanted region. The PN-junction diode in the semiconductor substrate may prevent noise from entering the capacitor to improve the noise immunity of the semiconductor device.

12 Claims, 6 Drawing Sheets

(56) References Cited

U.S. PATENT DOCUMENTS

| | | | | |
|---|---|---|---|---|
| 2008/0035965 A1* | 2/2008 | Hayashi | ............ | H01L 27/14647 |
| | | | | 257/291 |
| 2012/0319240 A1* | 12/2012 | Su | ....................... | H01L 29/6609 |
| | | | | 257/538 |
| 2014/0225220 A1* | 8/2014 | Tamagawa | .......... | H01L 27/0802 |
| | | | | 257/529 |
| 2016/0300907 A1* | 10/2016 | Selvaraj | .............. | H01L 29/0646 |

* cited by examiner

STACK MOM CAPACITOR STRUCTURE FOR CIS

CROSS-REFERENCES TO RELATED APPLICATIONS

This application claims priority to Chinese patent application No. 201410486996.1, filed on Sep. 22, 2014, the content of which is incorporated herein by reference in its entirety.

BACKGROUND OF THE INVENTION

The present invention relates to semiconductor technology, and more particularly to a semiconductor device and method of manufacturing the same.

In semiconductor technology, a semiconductor capacitor is one of the key components of an integrated circuit device. A metal-oxide-metal (MOM) capacitor has many advantages due its compatibility with a copper interconnect structure to achieve a high-density capacitor, thus, it has been widely used in semiconductor devices. For example, conventional CMOS image sensors (CIS) utilize MOM capacitor structures.

FIG. 1A is a cross-sectional view illustrating a relevant portion of a semiconductor device in the prior art. The portion of the semiconductor device includes a substrate 100, a shallow trench isolation (STI) 102 in substrate 100, and a MOM capacitor 106 disposed over the STI 102. MOM capacitor 106 includes multiple comb-shaped metal layers stacked on top of each other, such as a first metal layer Ml, metal layer M2, and a third metal layer M3. An intermetallic dielectric layer is interposed between first, second, and third metal layers Ml, M2, and M3. The portion of the semiconductor device further includes a p-well 101 disposed below STI 102. P-well 101 is located within the periphery of a p+ion implanted region 103 that is connected to first metal layer M1 through a contact hole 105 disposed in an interlayer dielectric layer (ILD) 104.

The above-described structure of the prior art generally has the following problems: when semiconductor substrate 100 is a p-type substrate, noise coming from the semiconductor substrate greatly affects the MOM capacitor and the capacitor formed between the metal layers and the p-well. FIG. 1B is a cross-sectional view illustrating the principles of the effect of noise from substrate 100. When semiconductor substrate 100 is a p-type substrate, noise may be propagating from semiconductor substrate 100 along p-well 101, p+ ion-implanted region 103, contact hole 105 to first metal layer M1, as indicated by the arrow shown in FIG. 1B. Thus, noise from semiconductor substrate 100 may be propagated to the MOM capacitor, first metal layer M1, and other capacitors connected with first metal layer M1. In practical applications, noise from the semiconductor substrate may adversely affect the MOM capacitor. When a semiconductor device includes other components such s a logic circuit, noise from the semiconductor substrate may also adversely affects the components. For example, in a logic circuit of a CMOS image sensor including the above-described MOM structure, noise from the p-type semiconductor substrate may cause flicker noise, fixed pattern noise and temporal noise, adversely affecting the performance of the CMOS image sensor.

Therefore, noise from the semiconductor device may adversely affect the performance of the above-described structure of the prior art. A novel structure and method of manufacturing the same is thus needed to solve the above problems.

BRIEF SUMMARY OF THE INVENTION

Embodiments of the present invention provide a semiconductor device and method of manufacturing the same to prevent noise coming from a semiconductor substrate from entering a capacitor disposed thereon.

In one embodiment, a semiconductor device includes a semiconductor substrate, an interlayer dielectric layer on the semiconductor substrate, a capacitor on the interlayer dielectric layer, and a PN-junction diode in the semiconductor substrate and below the capacitor, the PN-junction diode comprising a p-type ion implanted region and an n-well located below the p-type ion implanted region and completely surrounding the p-type ion implanted region.

In one embodiment, the capacitor is a metal-oxide-metal capacitor including a first metal layer, a second metal layer, and a third metal layer, a first intermetallic dielectric layer is disposed between the first and second metal layers, and a second intermetallic dielectric layer is disposed between the second and third metal layers.

In one embodiment, the semiconductor device may further include a contact hole in the interlayer dielectric layer, the contact hole includes a first end connected to the p-type ion implanted region and a second end connecting to the first metal layer, the first end and the second end are opposite to each other.

In one embodiment, a projection of the capacitor onto a surface of the semiconductor substrate is completely within the p-type ion implanted region.

In one embodiment, the n-well is formed by using an ion implantation process comprising arsenic ions, an energy of 300 keV, a dose of $2.6E12$ ions/cm$^2$, and an implantation angle of 7 degrees. The p-type ion implanted region is formed by using an ion implantation process comprising boron ions, an energy of 30 keV, a dose of 1E12 ions/cm2, and an implantation angle of 0 degree.

In one embodiment, the semiconductor device of claim 1 may also includes a CMOS image sensor comprising a photodiode including a p-type region and an n-type region, the p-type region and the -type ion implanted region have a same first material, and the n-type region and the n-well have a same second material.

In one embodiment, the semiconductor device may include a CMOS image sensor containing the PN-junction diode.

Embodiments of the present invention also provide a method for manufacturing a semiconductor device. The method may include providing a semiconductor substrate, forming a PN-junction diode comprising a p-type ion implanted region formed in the semiconductor substrate and an n-well formed below the p-type ion implanted region and surrounding the p-type ion implanted region, (S101), forming an interlayer dielectric layer on the semiconductor substrate, forming a contact hole in the interlayer dielectric layer (S102), and forming a capacitor on the interlayer dielectric layer above the PN-junction diode (S103).

In one embodiment, forming the capacitor may include forming a first metal layer on the interlayer dielectric layer, forming a first intermetallic dielectric layer on the first metal layer, forming a second metal layer on the first intermetallic dielectric layer, forming a second intermetallic dielectric layer on the second metal layer, and forming a third metal layer on the second intermetallic dielectric layer.

In one embodiment, the method also includes connecting the p-type ion implanted region with a first end of the contact hole, and connecting the first metal layer with a second end of the contact hole, the first and second ends are opposite to each other.

In one embodiment, a projection of the capacitor onto a surface of the semiconductor substrate is completely within the p-type ion implanted region.

In one embodiment, forming the n-well includes performing an ion implantation comprising arsenic ions into the semiconductor substrate with an energy of 300 keV, a dose of 2.6E12 ions/cm$^2$, and an angle of 7 degrees. Forming the p-type ion implanted region includes performing an ion implantation comprising boron ions into the semiconductor substrate with an energy of 30 keV, a dose of 1E12 ions/cm2, and an angle of 0 degree.

In one embodiment, the semiconductor includes a CMOS image sensor having a photodiode including a p-type region and an n-type region, the p-type region is concurrently formed with the p-type ion implanted region in the same first process, and the n-type region being concurrently formed with the n-well in the same second process.

Embodiments of the present invention also provides an electronic device comprising a semiconductor device and an electronic component connect to the semiconductor device. The semiconductor device includes a semiconductor substrate, an interlayer dielectric layer on the semiconductor substrate, a capacitor on the interlayer dielectric layer, and a PN-junction diode in the semiconductor substrate and below the capacitor. The PN-junction diode includes a p-type ion implanted region and an n-well located below the p-type ion implanted region and completely surrounding the p-type ion implanted region.

The following description, together with the accompanying drawings, will provide a better understanding of the nature and advantages of the claimed invention.

DETAILED DESCRIPTION OF THE INVENTION

Figure 1A:
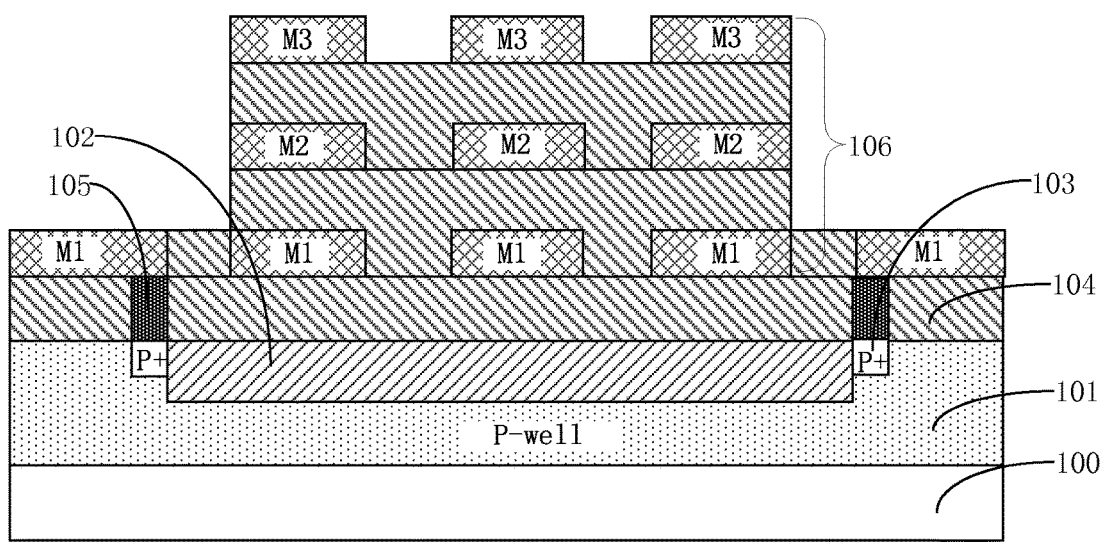
FIG. 1A is a cross-sectional view illustrating a metal-oxide-metal capacitor and an associated structure of a semiconductor device in the prior art.
Figure 1B:
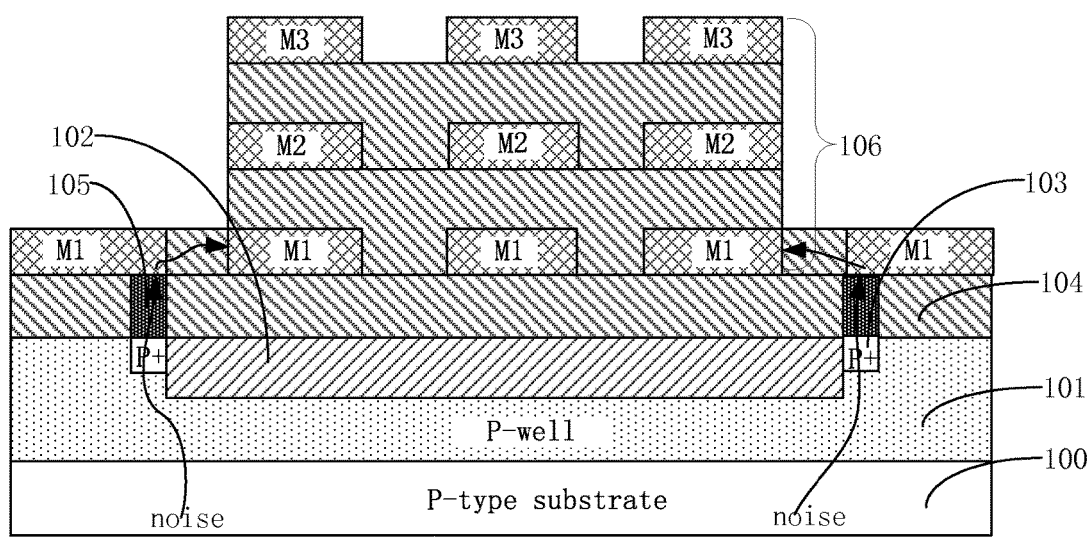
FIG. 1B is a cross-sectional view illustrating the noise impact from a p-type semiconductor substrate on the metal-oxide-metal capacitor in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Embodiment 1

Figure 2:
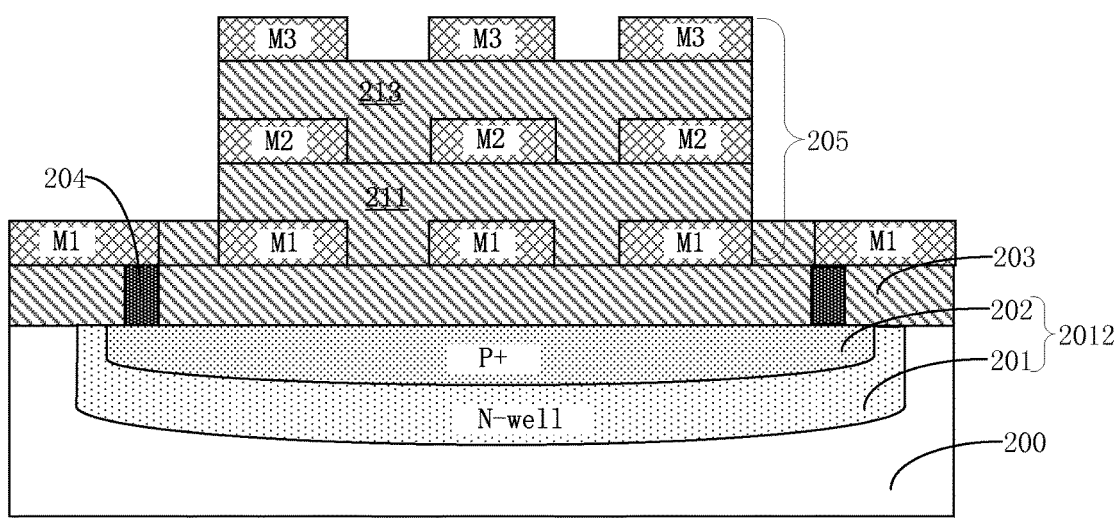
FIG. 2 is a cross-sectional view illustrating a semiconductor device according to an embodiment of the present invention.

FIG. 2 is a cross-sectional view illustrating a semiconductor device according to an embodiment of the present invention. As shown in FIG. 2, the semiconductor device includes a semiconductor substrate 200, an interlayer dielectric layer (ILD) 203 disposed on semiconductor substrate 200, and a metal-oxide-metal (MOM) capacitor 205 disposed on ILD 203. MOM capacitor 205 may include any conventional MOM capacitor structure and is not limited thereto. In the example shown, MOM capacitor 205 may include a first metal layer M1, a second metal layer M2, and a third metal layer M3. There is an intermetallic dielectric layer 211 between first and second metal layers M1, M2 and an intermetallic dielectric layer 213 between second and third metal layers M2, M3.

In accordance with the present invention, the semiconductor device further includes a PN-junction diode 2012 formed of a p-type ion implanted region 202 and an n-well 201 disposed below MOM capacitor 205 and with semiconductor substrate 200. N-well 201 is located below p-type ion implanted region 202 and surrounds p-type ion implanted region 202 within semiconductor substrate 200, as shown in FIG. 2. P-type ion implanted region 202 of PN-junction diode 2012 is connected to first metal layer M1 through a contact hole (CT) 204.

n an embodiment, semiconductor substrate 200 may be a p-type substrate or an n-type substrate. P-type ion implanted region 202 may be a p+implanted region. A p+implanted region is referred to as a heavily doped region having a doping concentration greater than E17 ($10^{17}$) p-type dopants/cm$^3$.

Referring to FIG. 2, it can be seen that, regardless of whether semiconductor substrate 200 is a p-type or n-type substrate, noise from the PN-junction diode formed of N-well 201 and p-type ion implanted region 202 in the reverse direction of the PN-junction diode may act as a barrier to prevent noise from semiconductor substrate 200 from entering MOM capacitor 205.

MOM capacitor 205 can be designed in such a way that the image of the projection of the MOM capacitor into the surface of the semiconductor substrate is completely within p-type ion implanted region 202. Such structure can better prevent noise coming from semiconductor substrate 200 from entering MOM capacitor 205.

In an embodiment, n-well 201 may be formed using the following process conditions:

the implanted ions are arsenic (As) ions, the implantation energy is about 300 keV, the implant dose is about 2.6E12 ($2.6 \times 10^{12}$ions/cm$^2$), the implantation angle (referred to as the incident angle of the ion beam with respect to the normal of the substrate surface) is about 7 degrees. Furthermore, the semiconductor substrate may be rotated four times while the ion implantation is performed. In an embodiment, the semiconductor substrate may be rotated during the ion implantation when the ion beam angle is large to prevent the shadow effect. For example, the semiconductor substrate may be rotated when an ion implantation is performed obliquely with respect to the normal of the substrate surface, such as the semiconductor substrate may be rotated four times, each time with a 90-degrees rotation.

P-type ion implanted region 202 may be formed under the following process conditions: the implanted ions are boron (B) ions, for example, BF2 may be used as the ion source, the implantation energy is about 30 keV, the implant dose is about 1E12 ($1 \times 10^{12}$ ions/cm$^2$), and the implantation angle (referred to as the incident angle of the ion beam with respect to the normal of the substrate surface) is 0 degree, i.e., the incident ion beam is perpendicular to the surface of the semiconductor substrate.

By utilizing the above described process conditions, a large and deep n-well and a small p-type ion implanted region can be formed.

In a specific embodiment of the present invention, the semiconductor device may include a CMOS image sensor (CIS). As known to those of skill in the art, a conventional CMOS image sensor generally includes multiple MOM capacitors and a CIS circuit disposed in different regions, the CIS circuit may include transistors (e.g., MOS transistors) and photodiodes (e.g., pinned diodes). A photodiode may include a p-type region and an n-type region in the semiconductor substrate. In an embodiment of the present invention, the PN-junction diode 2012 formed of the p-type ion implanted region 202 and n-well 201 below MOM capacitor 202 and the photodiode of the CIS circuit are concurrently implemented using the same process. In particular, n-well 201 and n-type photodiode region are formed in a same manufacturing process, and p-type ion implanted region 202 and the p-type region of the photodiode are concurrently formed using a same manufacturing process. That is, n-well 201 and n-type photodiode region are formed in the same process and have the same material, and the p-type ion implanted region 202 and the p-type photodiode region are formed in the same process and have the same material. Thus, an additional manufacturing step can be avoided in the manufacturing of PN-junction diode 2012.

In another embodiment of the present invention, the PN-junction diode 2012 formed of the p-type ion implanted region 202 and n-well 201 below MOM capacitor 202 may be used as a photodiode of the CIS circuit. In this case, there is no need to change the structure of the MOM capacitor, and only a large-sized photodiode is formed below the MOM capacitor. Obviously, this configuration of integrating the MOM capacitor and the photodiode of the CIS circuit in the same region not only forms the photodiode and stops noise from the semiconductor substrate, but also reduces the area of the semiconductor device to facilitate the miniaturization of the semiconductor device.

In accordance with the present invention, the semiconductor device may further include other active and/or passive components, such as transistors, resistors, etc. In addition, in the embodiment of the present invention, MOM capacitor 206 may be replaced with other types of capacitors, e.g., a capacitor having a stacked structure including an active region, a polysilicon and a metal layer. When the MOM capacitor is replaced with other capacitor structures, the PN-junction diode 2012 can still prevent noise from entering the capacitor structure.

In accordance with the present invention, due to the inclusion of the PN-junction diode formed of a n-well and a p-type ion implanted region below the capacitor, it is possible to prevent noise from entering the capacitor, thereby improving the noise immunity of the semiconductor device.

Embodiment 2

Figure 3A:
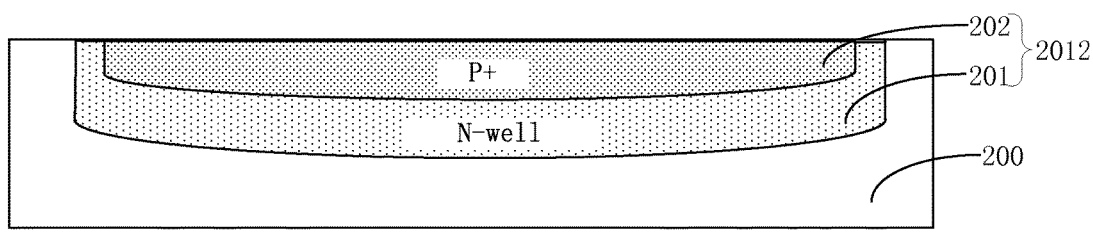
FIGS. 3A through 3C are cross-sectional views of intermediate structures associated with a method of manufacturing a semiconductor device according to an embodiment of the present invention.
Figure 3B:
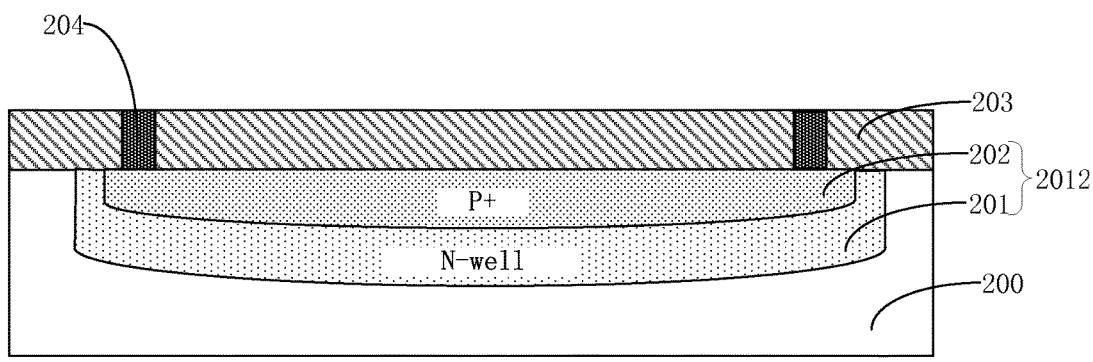
Figure 3C:
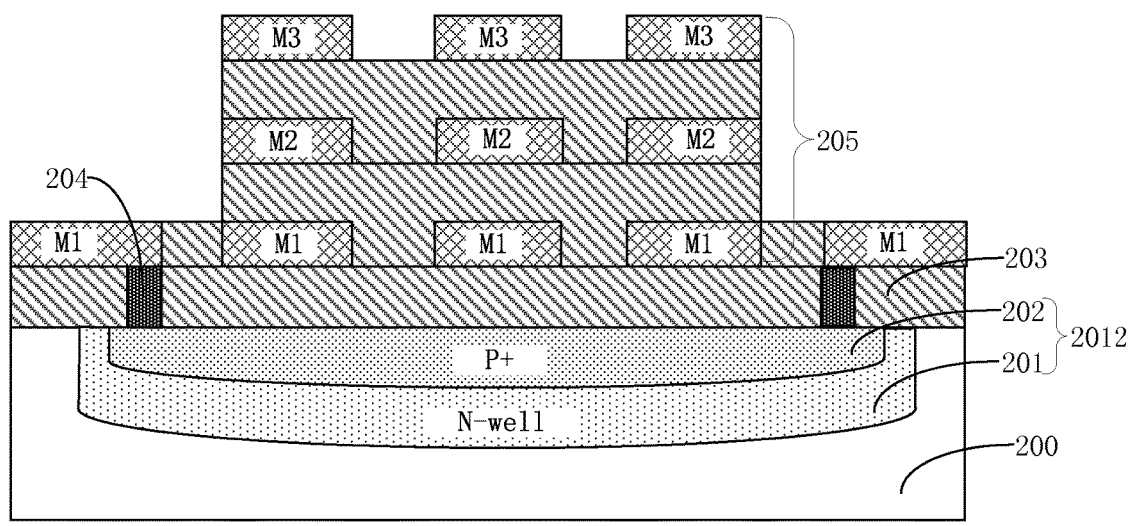
Figure 4:
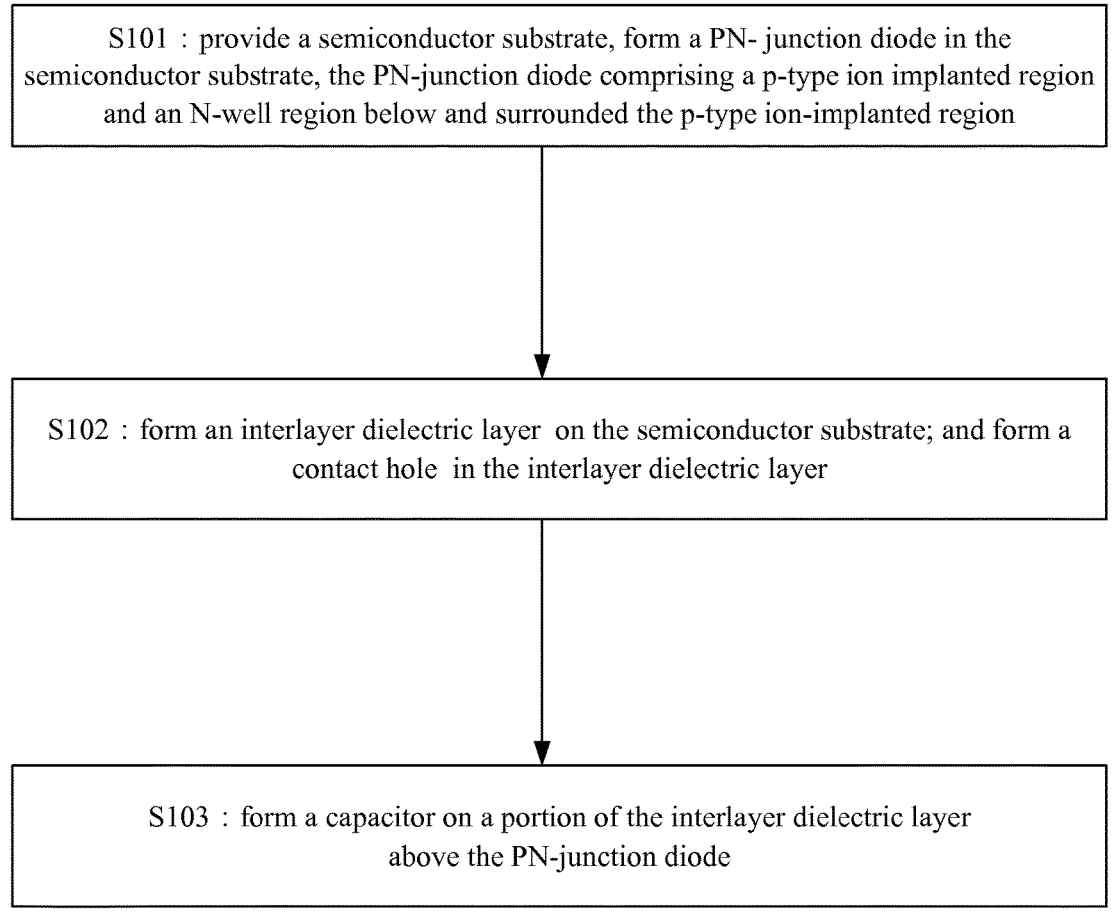
FIG. 4 is a flow chart of a method of manufacturing a semiconductor device according to an embodiment of the present invention.

FIG. 4 is a flow chart of a method for manufacturing a semiconductor device according to an embodiment of the present invention, as illustrating in FIGS. 3A, 3B and 3C.

Referring to FIGS. 3A, 3B and 3C, a method for manufacturing a semiconductor device may include the following steps:

A1: providing a semiconductor substrate 200, forming a PN-junction diode 2012 comprising a p-type ion implanted region 202 and an n-well 201 disposed below p-type ion implanted region 202 and completely surrounding p-type ion implanted region 202 within semiconductor substrate 200, as shown in FIG. 3A.

In an embodiment, n-well 201 is formed in accord with the following process conditions: the implanted ions are arsenic (As) ions, the implantation energy is about 300 keV, the implant dose is about 2.6E12, the implantation angle (referred to as the incident angle of the ion beam with respect to the normal of the substrate surface) is about 7 degrees. Furthermore, the semiconductor substrate may be rotated four times while the ion implantation is performed. In an embodiment, the semiconductor substrate may be rotated during the ion implantation when the ion beam angle is large to prevent the shadow effect. For example, the semiconductor substrate may be rotated when an ion implantation is performed obliquely with respect to the normal of the substrate surface, such as the semiconductor substrate may be rotated four times, each time with a 90-degrees rotation.

P-type ion implanted region 202 is formed in accord with the following process conditions: the implanted ions are boron (B) ions, for example, $BF_2$ may be used as the ion source, the implant energy is 30 keV, the implant dose is about 1E12 ions/$cm^2$, and the implantation angle (referred to as the incident angle of the ion beam with respect to the normal of the substrate surface) is 0 degree, i.e., the incident ion beam is perpendicular to the surface of the semiconductor substrate.

The ion implantation when performed with the above described process conditions provides a large and deep n-well and a small p-type ion implanted region.

In a specific example, the semiconductor device according to the present invention may include a conventional CMOS image sensor (CIS), which may typically include multiple MOM capacitors and a CIS circuit disposed in different regions, the CIS circuit may include transistors (e.g., MOS transistors) and photodiodes (e.g., pinned diodes). A photodiode may include a p-type region and an n-type region in the semiconductor substrate. In an embodiment of the present invention, the PN-junction diode 2012 formed of the p-type ion implanted region 202 and n-well 201 below MOM capacitor 202 and the photodiode of the CIS circuit are implemented using the same process. In particular, n-well 201 and n-type photodiode region are formed using a same manufacturing process, and p-type ion implanted region 202 and the p-type region of the photodiode are formed using a same manufacturing process. That is, n-well 201 and n-type photodiode region are formed using the same process and have the same material, and the p-type ion implanted region 202 and the p-type photodiode region are formed using the same process and have the same material. Thus, an additional manufacturing step can be eliminated in the manufacturing of PN-junction diode 2012. In another embodiment of the present invention, the PN-junction diode 2012 formed of the p-type ion implanted region 202 and n-well 201 below MOM capacitor 202 may be used as a photodiode of the CIS circuit. In this case, there is no need to change the structure of the MOM capacitor, and only a large-sized photodiode needs to be formed below the MOM capacitor. Obviously, the integration of the MOM capacitor and the photodiode of the CIS circuit in the same region not only forms the photodiode and stops noise from the semiconductor substrate, but also reduces the area of the semiconductor device, thereby facilitating the miniaturization of the semiconductor device.

A2: forming an interlayer dielectric layer 203 on semiconductor substrate 200; and forming a contact hole 204 in interlayer dielectric layer 203. Contact hole 202 is connected to p-type ion implanted region 202, as shown in FIG. 3B.

A3: forming a MOM capacitor 205 on a portion of interlayer dielectric layer 203 located above PN-junction diode 2012, as shown in FIG. 3C.

MOM capacitor 205 may include any conventional MOM capacitor structure and is not limited thereto. MOM capacitor 205 may include a first metal layer M1, a second metal layer M2, and a third metal layer M3. There is a first intermetallic dielectric layer 211 between first and second metal layers M1, M2 and a second intermetallic dielectric layer 213 between second and third metal layers M2, M3. In an exemplary embodiment, contact hole 204 has a first end connected to p-type ion implanted region 202 and a second end connected to first metal layer M1, the first and second ends are opposite to each other. P-type ion implanted region 202 and first metal layer M1 are thus connected to each other through contact hole 204.

The above-described PN-junction diode structure, in accordance with the present invention, can act as a barrier to prevent noise of the semiconductor substrate from entering MOM capacitor 205.

In accordance with the present invention, the semiconductor device may further include other active and/or passive components, such as transistors, resistors, etc. In addition, in the embodiment of the present invention, MOM capacitor 206 may be replaced with other types of capacitors, e.g., a capacitor having a stacked structure including an active region, a polysilicon and a metal layer. When the MOM capacitor is replaced with other capacitor structures, the PN-junction diode 2012 can still prevent noise from entering the capacitor structure.

In accordance with the present invention, due to the inclusion of the PN-junction diode formed of a n-well and a p-type ion implanted region below the capacitor, it is possible to prevent noise from entering the capacitor, thereby improving the noise immunity of the semiconductor device.

FIG. 4 is a flow chart of a method for manufacturing a semiconductor device according to an embodiment of the present invention. The method of FIG. 4 includes:

S101: providing a semiconductor substrate; forming a PN-junction diode in the semiconductor substrate comprising a p-type ion implanted region and an n-well below the p-type ion implanted region and surrounding the p-type ion implanted region;

S102: form an interlayer dielectric layer on the semiconductor substrate; form a contact hole in the interlayer dielectric layer;

S103: form a capacitor on a portion of the interlayer dielectric layer above the PN-junction diode.

In an embodiment, the capacitor is a MOM capacitor. The method of forming the MOM capacitor may include forming a first metal layer on the interlayer dielectric layer, forming a first intermetallic dielectric layer on the first metal layer, forming a second metal layer on the first intermetallic dielectric layer, forming a second intermetallic dielectric layer on the second metal layer, and forming a third metal layer on the second intermetallic dielectric layer.

In an embodiment, the method also include connecting the p-type ion implanted region with a first end of the contact hole, and connecting the first metal layer with a second end of the contact hole, the first and second ends are opposite to each other.

Embodiment 3

Embodiments of the present invention provide an electronic device including a semiconductor device and an electronic component connected to the semiconductor device. The semiconductor device can be the semiconductor device of embodiment 1 described above and manufactured using the method described in embodiment 2. The electronic component can be a discrete device, an integrated circuit, or it can include multiple chips, and others.

In an embodiment, the electronic device may include a semiconductor device and an electronic component connected to the semiconductor device. The semiconductor device may include a semiconductor substrate, an interlayer dielectric layer on the semiconductor substrate, and a capacitor on the interlayer dielectric layer. The semiconductor device may further include a PN-junction diode formed of a p-type ion implanted region and an n-well disposed below the p-type ion implanted region and completely surrounding the p-type ion implanted region.

In accordance with the present invention, the electronic device may be a mobile phone, a laptop computer, a netbook, a tablet PC, a game console, a TV receiver, a DVD player, a GPS device, a camera, a voice recorder, MP3, MP4, PSP players, and other semiconductor devices including intermediate products and electronic components that may include a capacitor (e.g., MOM capacitor) and the above-described PN-junction diode located below the capacitor and acts as a barrier to prevent noise from entering the capacitor.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
    a semiconductor substrate;
    an interlayer dielectric layer on the semiconductor substrate;
    a metal-oxide-metal capacitor on the interlayer dielectric layer, the capacitor comprising a first metal layer, a second metal layer, and a first intermetallic dielectric layer disposed between the first and second metal layers;
    a PN-junction diode in the semiconductor substrate and below the capacitor, the PN-junction diode comprising a p-type ion implanted region and an n-well located below the p-type ion implanted region and completely surrounding the p-type ion implanted region; and
    a contact hole in the interlayer dielectric layer and having a first end connected to the p-type ion implanted region and a second end connected to the first metal layer.

2. The semiconductor device of claim 1, wherein the capacitor further comprises a third metal layer, and a second intermetallic dielectric layer disposed between the second and third metal layers.

3. The semiconductor device of claim 1, wherein the n-well is formed by using an ion implantation process comprising arsenic ions, an energy of 300 keV, a dose of 2.6E12 ions/cm$^2$, and an implantation angle of 7 degrees.

4. The semiconductor device of claim 1, wherein the p-type ion implanted region comprises a doping concentration greater than $1 \times 10^{17}$ dopants/cm$^3$.

5. The semiconductor device of claim 1, further comprising:
    a CMOS image sensor comprising a photodiode including a p-type region and an n-type region, the p-type region and the p-type ion implanted region comprising a same first material, and the n-type region and the n-well comprising a same second material.

6. The semiconductor device of claim 1, further comprising:
    a CMOS image sensor comprising the PN-junction diode.

7. An electronic device comprising a semiconductor device and an electronic component connect to the semiconductor device, wherein the semiconductor device comprises:
    a semiconductor substrate;
    an interlayer dielectric layer on the semiconductor substrate;
    a metal-oxide-metal capacitor on the interlayer dielectric layer, the capacitor comprising a first metal layer, a second metal layer, and a third metal layer, a first intermetallic dielectric layer disposed between the first and second metal layers, and a second intermetallic dielectric layer disposed between the second and third metal layers;
    a PN-junction diode in the semiconductor substrate and below the capacitor, the PN-junction diode comprising a p-type doped region and an n-well located below the p-type doped region and completely surrounding the p-type doped region, and
    a contact hole in the interlayer dielectric layer and having a first end connected to the p-type doped region and a second end connected to the first metal layer, wherein a projection of the capacitor onto a surface of the semiconductor substrate is completely within the p-type doped region.

8. The electronic device of claim 7, wherein the semiconductor device further comprises a CMOS image sensor comprising a photodiode including a p-type region and an n-type region, the p-type region and the p-type ion implanted region comprising a same first material, and the n-type region and the n-well comprising a same second material.

9. The electronic device of claim 7, wherein the semiconductor device further comprises a CMOS image sensor comprising the PN-junction diode.

10. The electronic device of claim 7, wherein the p-type doped region has a doping concentration greater than $1 \times 10^{17}$ dopants/cm$^3$.

11. The electronic device of claim 7, wherein the p-type doped region comprises a boron doped region.

12. The electronic device of claim 7, wherein the n-well comprises an arsenic doped region.

* * * * *